US011018425B1

United States Patent
Hageman et al.

(10) Patent No.: US 11,018,425 B1
(45) Date of Patent: May 25, 2021

(54) ACTIVE ELECTRONICALLY SCANNED ARRAY WITH POWER AMPLIFIER DRAIN BIAS TAPERING FOR OPTIMAL POWER ADDED EFFICIENCY

(71) Applicant: Rockwell Collins, Inc., Cedar Rapids, IA (US)

(72) Inventors: Michael L. Hageman, Mount Vernon, IA (US); David W. Cripe, Mount Vernon, IA (US); Robert A. Kertis, Rochester, MN (US); Bryan S. McCoy, Cedar Rapids, IA (US); Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 225 days.

(21) Appl. No.: 14/702,068

(22) Filed: May 1, 2015

(51) Int. Cl.
*H01Q 3/34* (2006.01)
*H03F 3/21* (2006.01)
(Continued)

(52) U.S. Cl.
CPC ............ *H01Q 3/34* (2013.01); *H01Q 3/267* (2013.01); *H03F 3/19* (2013.01); *H03F 3/211* (2013.01); *H03F 2200/451* (2013.01)

(58) Field of Classification Search
CPC .......... G01S 7/02; G01S 7/03; G01S 13/4463; G01S 13/953; H01Q 3/005; H01Q 3/34; H01Q 21/0025; H01Q 1/02; H01Q 3/40; H01Q 21/22; H01Q 3/267; H01Q 19/12; H03F 1/0211; H03F 1/0261; H03F 1/0205; H03F 3/217; H03F 3/195; H03F 3/21; H03F 3/211; G01R 19/30; G01R 31/2884;
(Continued)

(56) References Cited

U.S. PATENT DOCUMENTS

| | | | |
|---|---|---|---|
| 3,593,138 A | * | 7/1971 | Dunn .................... H04B 7/2126 375/211 |
| 3,688,208 A | * | 8/1972 | Kandiah ................. H03F 1/083 330/271 |

(Continued)

OTHER PUBLICATIONS

M. Macdonald et al., The International Handbook of Space Technology, Springer, p. 432, 2014 (Year: 2014).*

(Continued)

*Primary Examiner* — Bernarr E Gregory
*Assistant Examiner* — Fred H Mull
(74) *Attorney, Agent, or Firm* — Suiter Swantz pc llo

(57) ABSTRACT

A system and method for operating a system including at least one active electronically scanned array (AESA) element incorporates drain voltage amplifier control (DRAVAC) to maintain the power amplifiers of the AESA elements at a constant gain compression level. A processor of the AESA system may dynamically program, monitor, or adjust each individual array element or component thereof. As the RF output power of the power amplifiers varies, constant gain compression is achieved by dynamically adjusting the RF input power and drain voltage to the power amplifiers. An AESA element may incorporate built-in self-test circuitry for detecting faults in the power supply to the power amplifiers as well as calibrating and calculating RF output power for a given input power by controlling the bias of a pass device serving as the amplifier current source.

12 Claims, 9 Drawing Sheets

(51) Int. Cl.
*H03F 3/19* (2006.01)
*H01Q 3/26* (2006.01)

(58) Field of Classification Search
CPC ... H04B 1/0458; H04B 7/2126; H01L 23/057; H01P 1/047
USPC ........................................................ 342/372
See application file for complete search history.

(56) References Cited

U.S. PATENT DOCUMENTS

| | | | | | |
|---|---|---|---|---|---|
| 4,538,170 | A | * | 8/1985 | Yerman | H01L 23/057 174/16.3 |
| 4,825,172 | A | * | 4/1989 | Thompson | H01Q 21/22 330/124 R |
| 4,901,032 | A | * | 2/1990 | Komiak | G01S 7/02 330/277 |
| 5,155,492 | A | * | 10/1992 | Hopwood | G01S 7/03 342/372 |
| 5,504,493 | A | * | 4/1996 | Hirshfield | H01Q 21/22 342/365 |
| 5,861,774 | A | * | 1/1999 | Blumenthal | G01R 31/2884 324/750.3 |
| 6,023,420 | A | * | 2/2000 | McCormick | H02P 27/06 336/212 |
| 6,034,633 | A | * | 3/2000 | Cassen | G01S 7/03 342/175 |
| 6,340,948 | B1 | * | 1/2002 | Munoz-Garcia | H01Q 21/22 342/354 |
| 6,404,404 | B1 | * | 6/2002 | Chen | H01Q 21/22 343/844 |
| 6,744,411 | B1 | * | 6/2004 | Osterhues | H01Q 3/34 343/754 |
| 7,474,249 | B1 | * | 1/2009 | Williams | G01S 7/02 342/25 R |
| 8,208,876 | B2 | * | 6/2012 | Drogi | H03F 1/0205 330/10 |
| 8,427,371 | B2 | * | 4/2013 | Pozgay | G01S 13/4463 342/373 |
| 8,903,342 | B1 | | 12/2014 | Wyse et al. | |
| 9,478,858 | B1 | * | 10/2016 | West | G01S 13/953 |
| 2005/0146479 | A1 | * | 7/2005 | Stenger | H01P 1/047 343/772 |
| 2007/0076774 | A1 | * | 4/2007 | Brown | H01Q 19/12 372/50.11 |
| 2008/0180176 | A1 | * | 7/2008 | Lee | H03F 1/0261 330/297 |
| 2008/0278236 | A1 | * | 11/2008 | Seymour | H03F 1/0211 330/279 |
| 2009/0174496 | A1 | * | 7/2009 | Van Bezooijen | H04B 1/0458 333/17.3 |
| 2009/0243931 | A1 | * | 10/2009 | Weckerle | H01Q 3/267 342/372 |
| 2012/0068906 | A1 | * | 3/2012 | Asher | H01Q 21/0025 343/853 |
| 2012/0075016 | A1 | * | 3/2012 | Visser | H04B 1/0458 330/116 |
| 2012/0252382 | A1 | * | 10/2012 | Bashir | H03F 3/217 455/114.3 |
| 2012/0313818 | A1 | * | 12/2012 | Puzella | H01Q 1/02 342/371 |
| 2013/0321087 | A1 | * | 12/2013 | Lender, Jr. | H03F 3/195 330/296 |
| 2014/0191808 | A1 | * | 7/2014 | Matsumoto | H03F 3/21 330/296 |
| 2014/0273817 | A1 | * | 9/2014 | Schiller | H01Q 3/40 455/39 |
| 2015/0015453 | A1 | * | 1/2015 | Puzella | H01Q 21/0025 343/853 |
| 2015/0270806 | A1 | * | 9/2015 | Wagh | H03F 3/211 330/296 |
| 2016/0169947 | A1 | * | 6/2016 | De Fazio | G01R 19/30 327/59 |

OTHER PUBLICATIONS

T.T. Taylor, Design of line-source antennas for narrow beamwidth and low side lobes, Transactions of the IRE Professional Group on Antennas and Propagation, vol. 3(1), p. 16-28, Jan. 1955 (Year: 1955).*
Dictionary definition for pulse amplitude modulation (PAM). (2001). In Hargrave's Communications Dictionary. Wiley. Credo Reference: https://search.credoreference.com/content/entry/hargravecomms/pulse_amplitude_modulation_pam/0 (Year: 2001).*
U.S. Appl. No. 13/714,209, filed Dec. 13, 2012, Wyse et al.
U.S. Appl. No. 13/737,777, filed Jan. 9, 2013, Wyse et al.
U.S. Appl. No. 14/206,632, filed Mar. 12, 2014, Wyse et al.
U.S. Appl. No. 14/030,557, filed Sep. 18, 2013, Hageman et al.
U.S. Appl. No. 14/136,440, filed Dec. 20, 2013, Buckley et al.
U.S. Appl. No. 14/607,878, filed Jan. 28, 2015, Xie et al.

* cited by examiner

United States Patent

ACTIVE ELECTRONICALLY SCANNED ARRAY WITH POWER AMPLIFIER DRAIN BIAS TAPERING FOR OPTIMAL POWER ADDED EFFICIENCY

CROSS-REFERENCE TO RELATED APPLICATIONS

The present application is related to U.S. patent application Ser. No. 13/714,209, filed Dec. 13, 2012. The present application is related to U.S. patent application Ser. No. 13/737,777, filed Jan. 9, 2013, which issued as U.S. Pat. No. 8,903,342 on Dec. 2, 2014. The present application is related to U.S. patent application Ser. No. 14/206,632, filed Mar. 12, 2014. The present application is related to U.S. patent application Ser. No. 14/030,557 filed Sep. 18, 2013. The present application is related to U.S. patent application Ser. No. 14/136,440, filed Dec. 20, 2013. The present application is related to U.S. patent application Ser. No. 14/607,878, filed on Jan. 28, 2015.

U.S. patent application Ser. Nos. 13/714,209, 13/737,777, 14/206,632, 14/030,557, 14/136,440, 14/607,878, and U.S. Pat. No. 8,903,342 are herein incorporated by reference in their entirety.

TECHNICAL FIELD

The inventive concepts disclosed herein relate generally to electronically scanned array antenna elements, and more particularly to systems and methods for maximizing the power added efficiency of an active electronically scanned array (AESA) antenna. Additionally, the concepts disclosed herein allow accurate control of the phase of the radio frequency power amplifier (RF PA) which is essential for precise transmitted beam and minimal side lobe generation of the antenna.

BACKGROUND

Active Electronically Scanned (AES) array antennas (AESAs, also known as phased array antennas) are commonly found in weather radar, search and rescue radar (SRR), due regard radar (DRR), synthetic aperture radar (SAR) and other next-generation systems. Electronically scanned (ES) arrays require phase shifters to steer the radiation beam. However, peak and root mean square (RMS) phase and amplitude errors in the phase shifters degrade system parameters. For example, periodic (ex.—deterministic) aperture errors cause peak periodic side lobe levels (SLL), while random RMS errors increase overall average noise levels due to "whitened" SLLs. It may therefore be desirable to remove both periodic and random amplitude and phase errors from the phase shifters.

Most AES arrays utilize uniform illumination in transmit (Tx) mode because multiple identical power amplifier (PA) modules throughout the array aperture may be operated in saturation mode (i.e., via conversion of direct current (DC) to maximum radio frequency (RF) power) to maximize power added efficiency (PAE). Many systems, however, may benefit from low SLL transmit patterns. For example, some modern AESA systems require a two-way SLL of −50 dBc (decibels relative to the carrier), where two-way SLL is the sum of receiver (Rx) SLL and Tx SLL. Uniformly illuminated rectangular Tx apertures are only capable of −13.5 dB SLL in the principal E and H planes. The resulting ultra-low Rx SLL requirements are difficult to realize with only uniform illumination.

For example, modern SAR, DRR, and SRR systems require that the AESA maintain 30 dBp SLL (decibels relative to peak power), implying a Tx power taper on the order of 10-20 dB for the AESA from the aperture's center to its edge. An X-band AESA may incorporate a multi-layer printed circuit board (PCB) including multiple unit cells (ex.—individual antenna elements). Each unit cell may include multiple transmit/receive modules (TRM) such as radio frequency integrated circuits (RFIC) or monolithic microwave integrated circuits (MMIC) on chips of gallium arsenide (GaAs) or silicon-germanium (SiGe). For example, a unit cell may include four MMIC amplifier RFIC modules (ex.—chips), each biased and phase-controlled by a single four-channel TRM chip.

However, the RFIC may not be designed for a phase-stable variable output power ($P_{out}$), which results in amplitude modulated to phase modulated, or AM-PM, distortion. For example, dynamic adjustment from a uniform aperture illumination to a SLL of −25 dBp variances in $P_{out}$ requires approximately 12 dB attenuation across the AESA aperture. This 12 dB power taper results in up to 75 degrees of parasitic phase modulation in conventional linear amplifiers driven into compression for highest PAE, compared to a target of 5-10 degrees of parasitic phase modulation.

An alternate strategy for reducing SLL involves tapering the radiated power by incorporating a series of fixed power amplifiers in the individual unit cells across the ES array. For example, the ES array may incorporate a selection of Tx/Rx modules with a variety of fixed peak power levels. Elements at or near the center of the array are radiated at the highest power levels, with element peak power levels symmetrically tapered toward the periphery of the array. Therefore all elements are operated at saturation to maximize PAE, but at different power levels. However, an array with, for example, three or five different peak power levels requires three or five distinct Tx/Rx modules, which in turn requires three or five times the part count and results in significantly increased recurring and non-recurring costs. Additionally, as $P_{out}$ levels are backed off from peak power levels, transmitter efficiency drops significantly and the previously described AM-PM distortions occur, creating AESA pattern distortions. It may therefore be desirable to taper radiated power across a multi-element ES array by setting and monitoring power levels and voltage levels on an element by element basis. It may additionally be desirable to maximize the power added efficiency of the RF power amplifier (RFPA) by maintaining the RFPA at a constant level of compression regardless of the required output power. It may further be desirable to improve overall antenna system performance by controlling radiated side lobe levels by producing a predictable amount of phase shift in the RFPA.

SUMMARY

In a first aspect, embodiments of the inventive concepts disclosed herein are directed to an active electronically scanned array (AESA) element. In one embodiment, the AESA element includes at least one first power source. In one embodiment, the AESA element includes at least one power amplifier supplied by a first drain voltage and configured to generate a first output power based at least on the first drain voltage. In one embodiment, the AESA element includes at least one pass device coupled to the at least one first power source and to the at least one power amplifier. In one embodiment, the AESA element includes at least one element configuration including at least one of a peak power level of the at least one power amplifier, a drain voltage, an RF drive power level, and an RF output power level. In one embodiment, the AESA element includes at least one controller coupled to the at least one pass device, the at least one controller configured to provide the at least one power amplifier with a first RF drive power, sense the at least one first drain voltage, and maintain the at least one power amplifier at a constant gain compression point based on at least one of the first RF output power, the at least one element configuration, and an instruction received from at least one processor of the AESA.

In an additional aspect, embodiments of the inventive concepts disclosed herein are directed to an active electronically scanned array (AESA) based system. In one embodiment, the AESA system includes at least one printed circuit board. In one embodiment, the AESA system includes at least one first array element coupled to the at least one printed circuit board, the at least one first array element including: at least one first DC power source; at least one first power amplifier having a first peak power level, the at least one first power amplifier supplied by a first drain voltage and configured to generate a first RF output power based at least on the first drain voltage; at least one first pass device coupled to the at least one first power source and to the at least one first power amplifier; at least one first element configuration including at least one of the first peak power level, a drain voltage, an RF drive power level, and an RF output power level; at least one first controller coupled to the at least one pass device, the at least one first controller coupled to the at least one first pass device and including a second power source; and at least one processor coupled to the at least one first controller and configured to define the at least one first element configuration, generate the at least one first instruction based on at least one of the at least one first element configuration and a first report generated by the at least one first controller, and send the at least one first instruction to the at least one first controller. For example, the at least one controller may be configured to provide the at least one first power amplifier with a first RF drive power, sense the at least one drain voltage, and maintain the at least one power amplifier at a first constant gain compression point as the first output power varies.

In a further aspect, embodiments of the inventive concepts disclosed herein are directed to a method for operating a system including at least one active electronically scanned array (AESA). In one embodiment, the method includes defining at least one first element configuration corresponding to a first array element of the one or more array elements, the at least one first array element including at least one first pass device and at least one first power amplifier having a first peak power level, the at least one first power amplifier supplied by a first drain voltage and configured to generate a first RF output power based on at least the first drain voltage, the at least one first element configuration including at least one of the first peak power level, a first drain voltage, a first RF drive power, a first constant gain compression point, and a first RF output power. In one embodiment, the method includes applying a first RF drive power to at least one first power amplifier of a first array element. In one embodiment, the method includes sensing the first drain voltage of the at least one first power amplifier. In one embodiment, the method includes maintaining the at least one first power amplifier at a constant gain compression point based on at least one of the first RF output power, the at least one first element configuration, and a first instruction generated by at least one processor of the AESA.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The advantages of the inventive concepts disclosed herein may be better understood by those skilled in the art by reference to the accompanying figures in which.

DETAILED DESCRIPTION

Features of the inventive concepts disclosed herein in their various embodiments are exemplified by the following descriptions with reference to the accompanying drawings, which describe the invention with further detail. These drawings depict only selected embodiments of the invention, and should not be considered to limit its scope in any way. The scope is limited only by the claims; various alternatives, modifications, and equivalents are encompassed. For the sake of clarity, technical material known in the related technical fields is not described in detail to avoid unnecessarily obscuring the description.

Embodiments of the inventive concepts disclosed herein may be implemented in active electronically scanned array (AESA) based systems. For example, embodiments may be implemented in a multifunction or next-generation ESA-based weather radar system. Embodiments may be implemented in government radar systems, e.g., maritime surveillance radar systems, unmanned aerial systems (UAS) such as detect-and-avoid or due regard radar (DRR) systems, maritime rotary wing search-and-rescue radar systems, and degraded visual environment (DVE) imaging systems. Embodiments may be implemented in low probability of intercept/low probability of detection (LPI/LPD) high data rate (HDR) directional link systems, e.g., for man packs, ground vehicles, maritime and airborne applications, satellite-on-the-move (SOTM) communications, or special operations. Embodiments may be implemented in government electronic attack systems or anti-access area denial (A2AD) burn-through jammer AESA systems.

Figure 1:
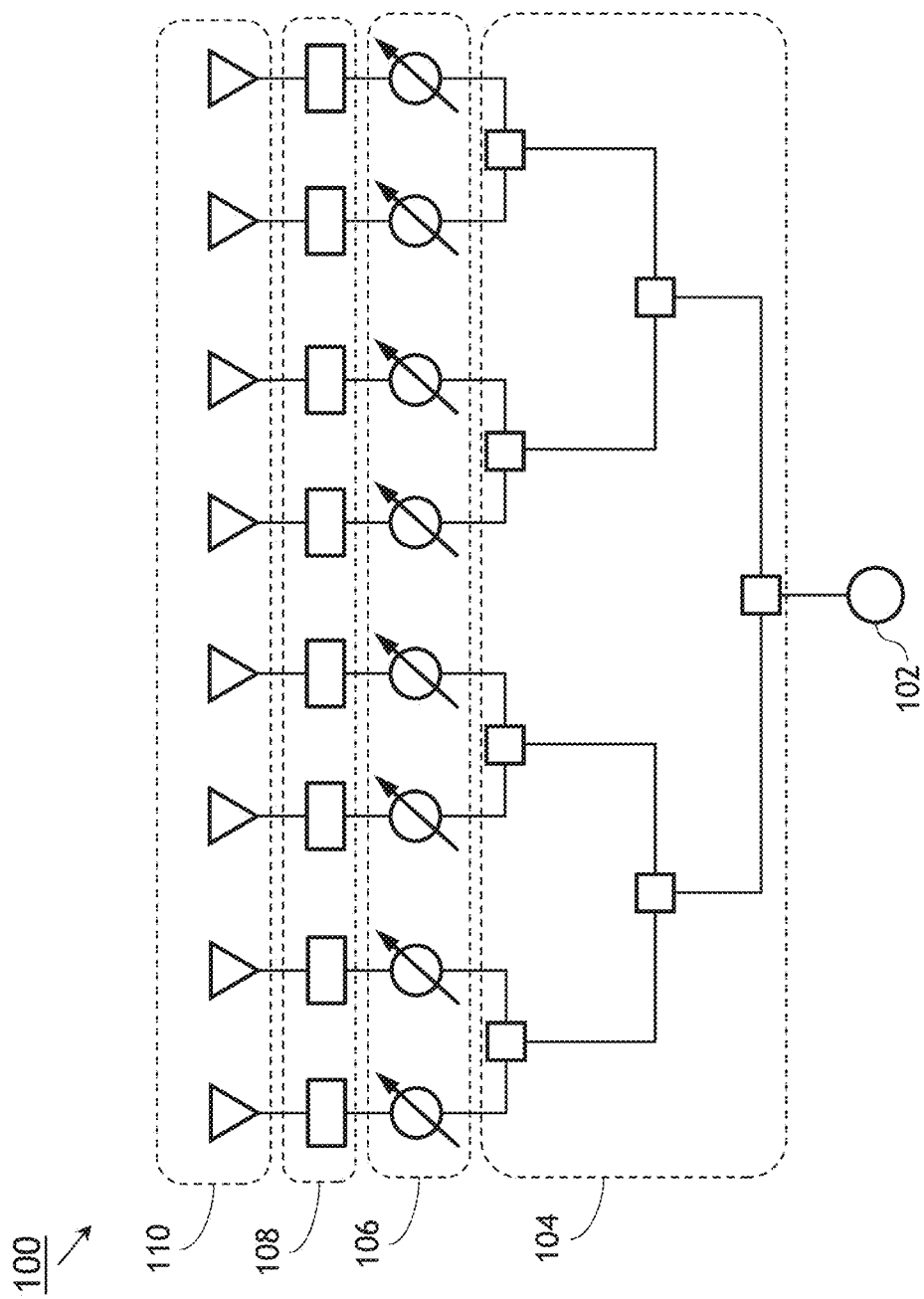
FIG. 1 is a block diagram of an active electronically scanned array (AESA) system.

FIG. 1 depicts a schematic illustration of embodiments of radiating elements 110 suitable for use in an AESA system 100. In one embodiment, a group of radiating elements 110 are arranged in linear fashion, as shown by FIG. 1. In other embodiments, an array of radiating elements 110 may be arranged in any suitable configuration. For example, radiating elements 110 may be arranged concentrically, with an inner first ring of radiating elements arranged within an outer second ring of radiating elements. Radiating elements 110 may also be arranged in a conventional XY array including X rows of radiating elements, each row including Y radiating elements 110. In one embodiment, radio frequency (RF) signal source 102 generates an RF signal to be emitted from the AESA 100 via radiating elements 110. For example, a network of power dividers 104 may divide the RF signal generated by source 102, and route the divided signals to individual radiating elements 110. In one embodiment, phase shifters 106 provide phase control for the RF signals provided to the individual radiating elements 110 by power dividers 104. In one embodiment, power amplifiers 108 control the transmit power of the RF signals provided to radiating elements 110. In some embodiments, phase shifters 106 and/or power amplifiers 108 are implemented as separate components or as part of separate components. For example, phase shifters 106 and power amplifiers 108 may be implemented within a portion, i.e., a transmit/receive (Tx/Rx) radio frequency integrated circuit (RFIC) of a multi-chip integrated circuit Tx/Rx module coupled to one or more radiating elements 110. In addition, Tx/Rx modules may be implemented utilizing a single channel or any number of suitable channels.

In one embodiment, radiating elements 110 are separated by a uniform distance. In other embodiments, radiating elements 110 are separated by any combination of suitable non-uniform distances. For example, individual radiating elements 110 may each emit an RF signal; the combination of one or more such signals may result in an electronically steerable beam. In one embodiment, power amplifiers 108 control the amplitudes of their respective RF signals, controlling the shape of the resulting steerable beam and of the resulting side lobes.

Figure 2B:
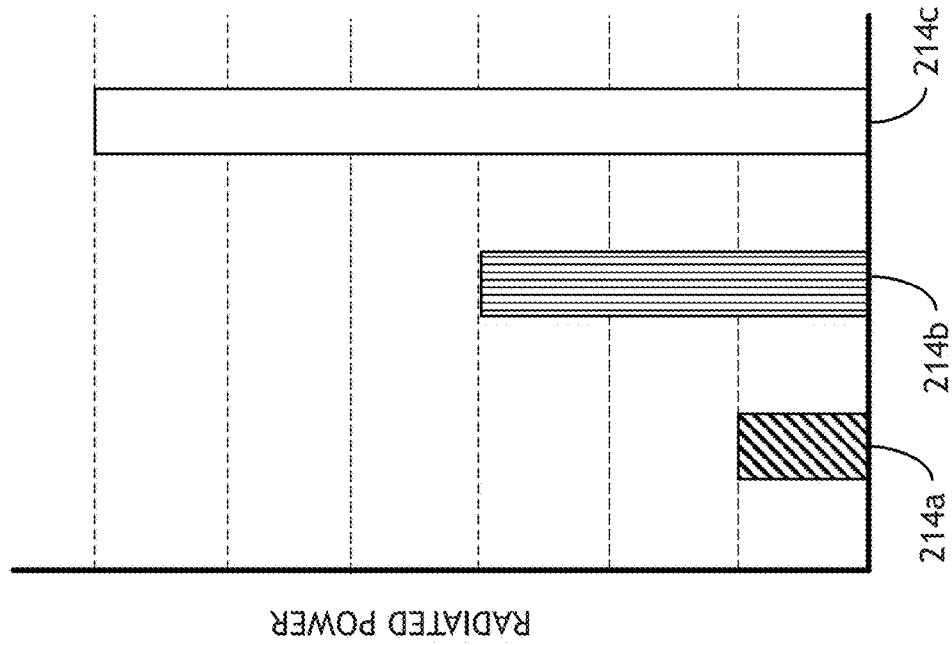
FIGS. 2A and 2B depict power tapering of AESA elements according to embodiments of the inventive concepts disclosed herein.
Figure 2A:
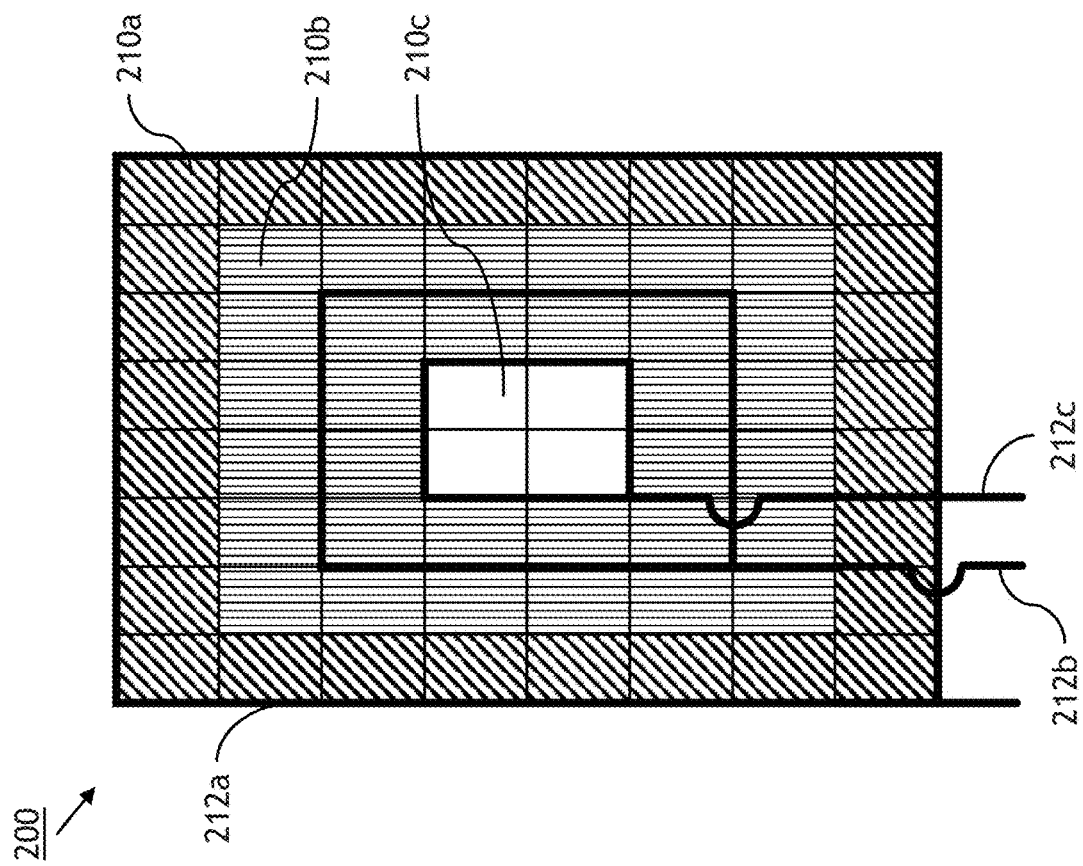

Referring to FIGS. 2A and 2B, an embodiment of an AESA 200 is shown, the AESA 200 including three sets of radiating elements (ex.—Tx/Rx modules): a first set of radiating elements 210a coupled to a first drain voltage (ex.—drain bias voltage) circuit line 212a; a second set of radiating elements 210b coupled to a second drain voltage circuit line 212b; and a third set of radiating elements 210c coupled to a third drain voltage circuit line 212c. In one embodiment, the AESA 200 includes other components and elements (not shown) generally found in an AESA. For example, power amplifiers or groups of power amplifiers (not shown) may be implemented within corresponding groups of Tx/Rx modules 210. AESA elements and components may include any appropriate combination of field effect transistors (FET), metal-semiconductor FETs (MESFET), gallium arsenide (GaAs) radio frequency integrated circuits (RFIC), gallium nitride (GaN) RFICs, silicon-germanium (SiGe) RFICs, high electron mobility transistors (HEMT), pseudomorphic HEMTs (pHEMT), silicon junction gate FETs (JFET), indium phosphide (InP) RFICs, or similar components.

In one embodiment, radiating elements 210a coupled to first drain voltage circuit line 212a include power amplifiers 214a (not shown) supplied (ex.—biased) by a first drain voltage; radiating elements 210b coupled to second drain voltage circuit line 212b include power amplifiers 214b (not shown) supplied by a second drain voltage; and radiating elements 210c coupled to third drain voltage circuit line 212c include power amplifiers 214c (not shown) supplied by a third drain voltage. For example, the first drain voltage, the second drain voltage, and the third drain voltage may all be different from one another, e.g., the first drain voltage may be higher than the second drain voltage, which in turn is higher than the third drain voltage. In one embodiment, supplying a higher drain voltage to a power amplifier 214 results generally in a higher RF output power (ex.—transmit power). For example, radiating elements 210a, 210b, 210c may include identical power amplifiers (not shown) with a fixed peak power level, i.e., the power amplifiers are designed to receive an RF drive power less than or equal to the peak power level. Tapering of RF output power across the AESA 200 can then be achieved by adjusting drain voltage levels. In one embodiment, one or more Tx/Rx modules 210a, 210b, 210c include a Tx/Rx RFIC (not shown) configured to dynamically adjust the drain voltage supplied to a given power amplifier or group of power amplifiers within a Tx/Rx module 210.

In one embodiment, tapering of output power across the AESA 200 is achieved through the use of multiple sets of power amplifiers 214a, 214b, 214c, wherein each power amplifier 214 of a set has a different peak power. For example, referring to FIG. 2B, a first power amplifier 214c may have a higher peak power then a second power amplifier 214b, which in turn may have a higher peak power than a third power amplifier 214a. Referring to FIG. 2A, in one embodiment, an AESA 200 incorporates one or more first power amplifiers 214c (not shown), or Tx/Rx modules (ex.—array elements) 210c including one or more first power amplifiers 214c having a high peak power, at or near the center of AESA 200. In one embodiment, the AESA 200 may further incorporate a concentric ring (e.g., a rectangular ring) of one or more second power amplifiers 214b (or Tx/Rx modules 210b) having a peak power lower than power amplifiers 214c. In one embodiment, the AESA 200 may further include an outer ring of one or more third power amplifiers 214a (or Tx/Rx modules 210a) having a peak power lower than power amplifiers 214b. In some embodiments, the individual power amplifiers 214 or array elements 210 of AESA 200 may be arranged in any appropriate configuration, including polygonal concentric rings of array elements, rows or columns of array elements, etc. For example, an AESA 200 incorporating multiple power amplifiers 214a, 214b, 214c may be operated to taper RF output power across the AESA while maximizing Power Added Efficiency (PAE) by operating all Tx/Rx modules 210 at saturation (i.e., at peak RF drive power).

Figure 3:
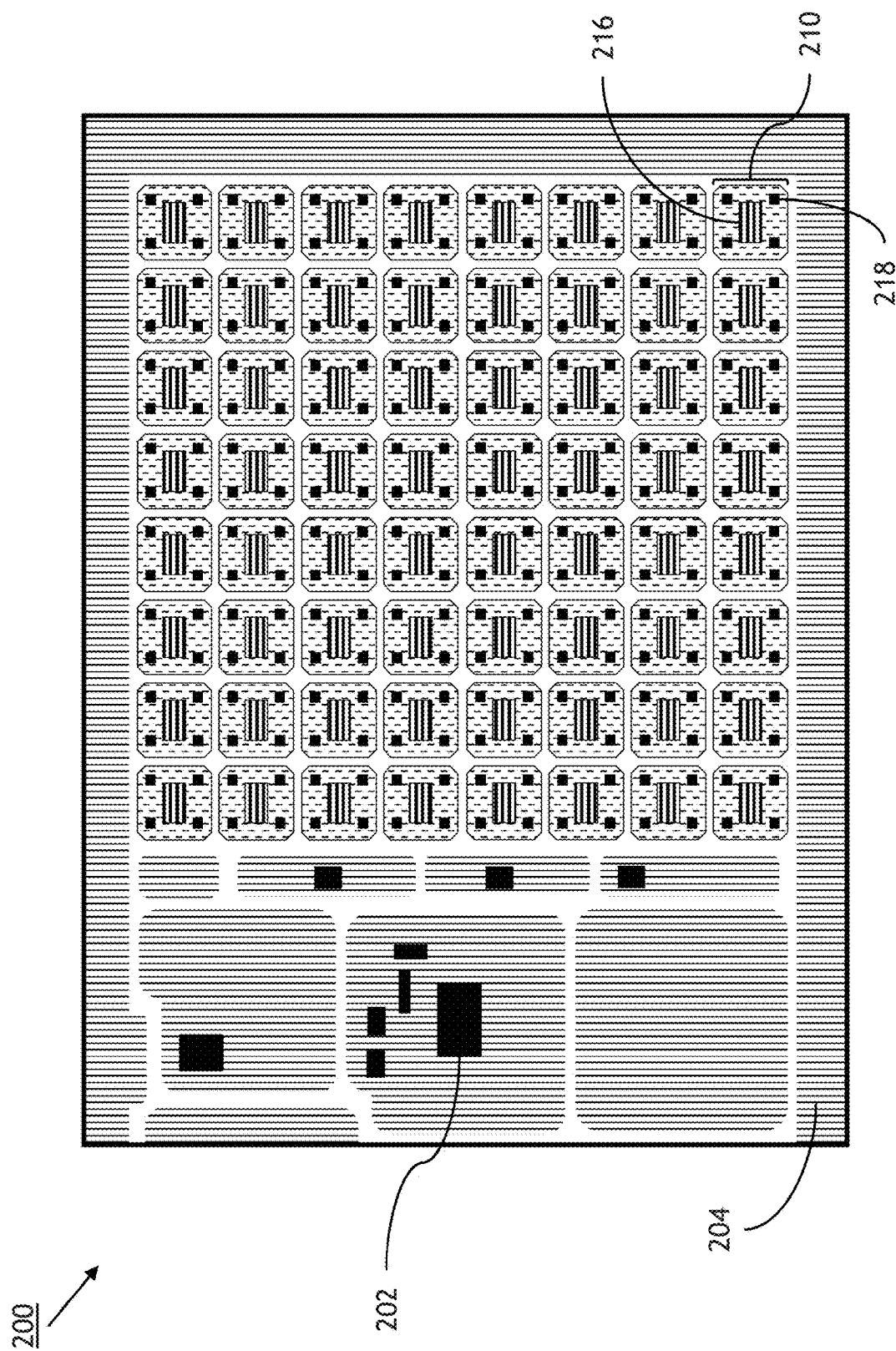
FIG. 3 depicts an AESA system according to embodiments of the inventive concepts disclosed herein.

Referring to FIG. 3, an embodiment of AESA 200 according to the inventive concepts disclosed herein incorporates a printed circuit board 204 (PCB; ex.—printed wiring board/PWB) and multiple individual Tx/Rx modules (ex.—array elements) 210. In one embodiment, an individual array element 210 includes one or more Tx/Rx RFICs 216. In one embodiment, the AESA 200 incorporates one or more processors 202 connected to PCB 204. In one embodiment, processor 202 is programmed to dynamically taper output power levels across the AESA 200 by setting, monitoring, and adjusting power levels for each individual Tx/Rx module 210 or component thereof. For example, depending on system needs and parameters, the processor 202 may define a power tapering configuration (ex.—element configuration) for one or more array elements 210 of AESA 200 that includes assigning a target RF drive power or drain voltage to each individual radio frequency power amplifier 214 (RF PA) (not shown, but incorporated into RFIC 218) of the array element 210. In one embodiment, the processor 202 maintains a preset element configuration by directing a controller 220 of one or more individual Tx/Rx modules 210 to adjust the RF drive power or drain voltage supplied to one or more RF power amplifiers 214 of the Tx/Rx modules 210 to maintain a defined gain compression level for the one or more power amplifiers 214. For example, drain voltage may include a supply voltage or drain voltage supplied to any appropriate active device or component thereof compatible with AESA system 200, including (but not limited to) collectors, bipolar transistors, field effect transistors, and vacuum tubes. In one embodiment, the processor 202 is programmed to receive outputs, data, alerts, or other messages from array elements 210 or from individual components thereof, such as a controller 220 of an individual array element 210. In one embodiment, the processor 202 is not physically contained within the AESA 200, but is implemented in a computing device physically or wirelessly coupled to the AESA 200.

Figure 4:
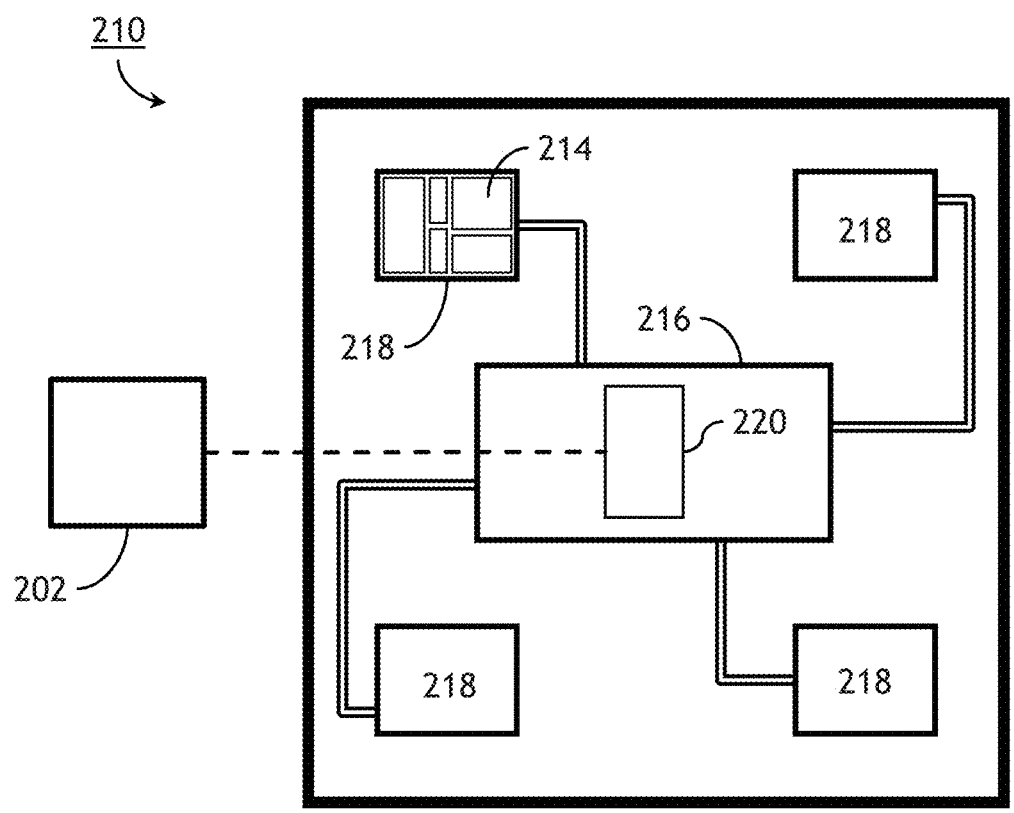
FIG. 4 is a block diagram of a 4 channel transmit/receive (Tx/Rx) module of an AESA element according to embodiments of the inventive concepts disclosed herein.

In one embodiment, referring to FIG. 4, an AESA array element 210 includes one four-channel Tx/Rx RFIC 216 and four supporting RFICs 218. For example, the four-channel Tx/Rx RFIC 216 may include a controller 220 for managing functions and operations of the supporting RFICs 218 and other components of the array element 210. In one embodiment, processor 202 is connected to controller 220. For example, the processor 202 may send instructions to controller 220 for the execution of component functions and operations such as setting, or adjusting, the RF drive power or drain voltage to an RF power amplifier 214. The controller 220 may then relay these commands to individual supporting RFICs 218 as appropriate. In one embodiment, the processor 202 receives alerts or reports from controller 220 concerning the operation of array element 210 and its individual components. For example, a fault detection circuit (not shown) within supporting RFIC 218 may detect a fault in the power supply to an RF power amplifier 214 incorporated within RFIC 218. The controller 220 may be notified of the fault, and in turn may notify processor 202 of the fault so appropriate action can be taken. In one embodiment, supporting RFIC 218 may incorporate components such as an RF power amplifier 214.

Figure 5A:
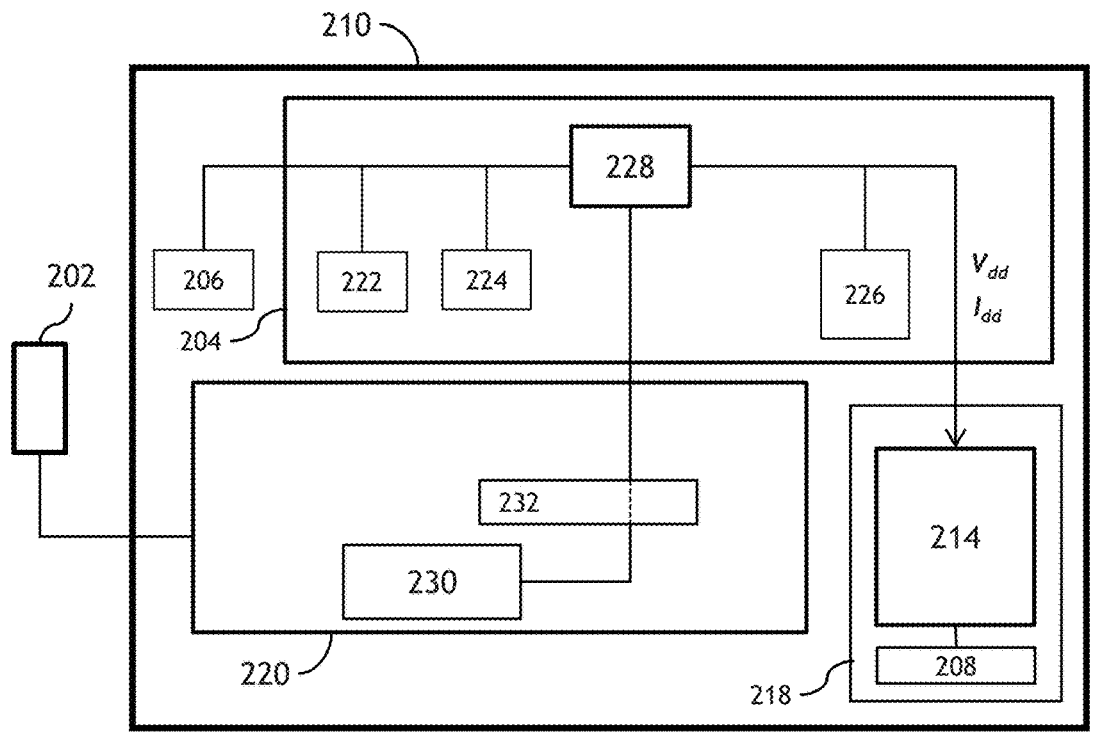
FIG. 5A is a block diagram.
Figure 5B:
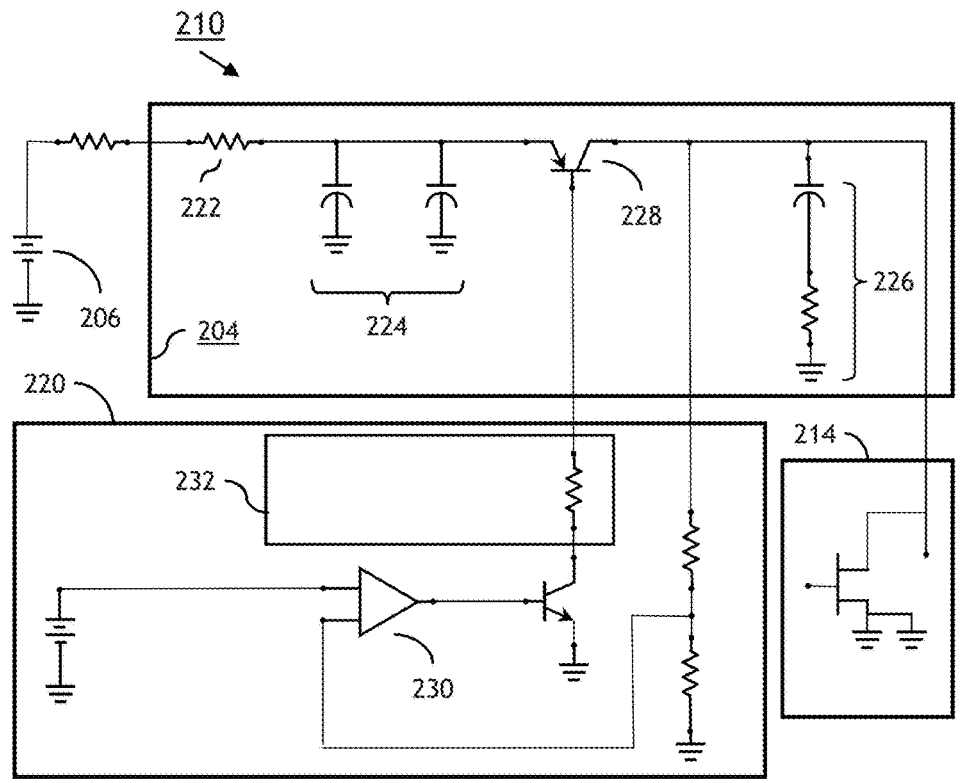
FIG. 5B is a schematic diagram, of a system for power amplifier drain bias tapering in an AESA system according to embodiments of the inventive concepts disclosed herein.

Referring to FIG. 5A, a block diagram is shown (FIG. 5B depicts the corresponding schematic diagram) of a drain voltage amplifier control (DRAVAC) system for maintaining a power amplifier 214 of an AESA array element 210 of an AESA system 200 at a constant gain compression point according to embodiments of the inventive concepts disclosed herein. For example, maintaining one or more RF power amplifiers 214 at a constant gain compression level maximizes power added efficiency (PAE) by enabling operation of the RF power amplifiers 214 at saturation regardless of the required output power. In addition, maintaining one or more RF power amplifiers 214 at a constant gain compression level by adjusting the drain voltage $V_{dd}$ and/or the RF drive power $P_{in}$ to the RF power amplifier 214 as output power $P_{out}$ varies (or according to a predetermined element configuration defined by the processor 202) may result in a predictable and more linear degree of phase shift in the RF power amplifier 214. Consequently, radiated side lobe levels (SLL) may be controlled, and the overall performance of the AESA antenna 200 enhanced.

In one embodiment, AESA element 210 includes a printed circuit board (PCB) 204. In one embodiment array element 210 is mounted to, or incorporates, a PCB 204 including one or more resistors 222 for short circuit protection, one or more capacitors 224 for bulk energy storage, and a possible loop compensation capacitor system 226. For example, short protection resistors 222 may protect the RF power amplifier 214 from a DC short. In addition, the loop compensation capacitor system 226 may stabilize the voltage control loop of a load (e.g., an FET, transistor, or other component of the RF PA 214). In one embodiment, the processor 202 (coupled to controller 220) and a DC power source 206 are mounted to the PCB 204 or otherwise incorporated into the AESA system 200. In one embodiment, PCB 204 includes a pass device 228 connecting the power source 206 and an RF power amplifier 214. For example, the pass device 228 may be a PNP bipolar-junction or field effect transistor (FET) configured to serve as a current source for RF power amplifier 214.

In one embodiment, an array element 210 includes a controller 220 connected to the pass device 228. For example, controller 220 may be housed in multichannel RFIC 216 (not shown), controlling one or more supporting RFICs 218 or RF power amplifiers 214 of an array element 210. In one embodiment, controller 220 includes a voltage regulator 230 configured to sense the drain voltage $V_{dd}$ of RF PA 214. For example, voltage regulator 230 may include one or more operational amplifiers and a current sensor 232 (ex.—fault detector) for sensing the base current of pass device 228 and adjusting the bias (ex.—Q-point) of the pass device 228 to maintain a desired drain voltage, and consequently a desired DC input power, to RF PA 214. If the load (ex.—transistor of RF power amplifier 214) or any other support components of RFIC 218 are shorted or otherwise display nonstandard characteristics, the fault detector 232 may alert the controller 220 or the processor 202 for corrective action. For example, if the load (RF power amplifier 214) is shorted the corresponding current $I_{dd}$ will be high; consequently the regulated output voltage $V_{dd}$ will not rise when directed. In the alternative, the load may be open and unable to draw the expected current $I_{dd}$ for a given voltage $V_{dd}$. The fault detector 232 may then signal the controller 220 or processor 202 to deactivate the operation of the array element 210 and its components. In addition, the processor 202 may account for the loss of RF power from a deactivated array element 210 in its antenna equations for beam control. In one embodiment, the pass device 228 is incorporated into the controller 220. In one embodiment, supporting RFIC 218 includes one or more heat sinks 208 or like devices for drawing excess heat from RF power amplifier 214 or other components of the array element 210.

Figure 6A:
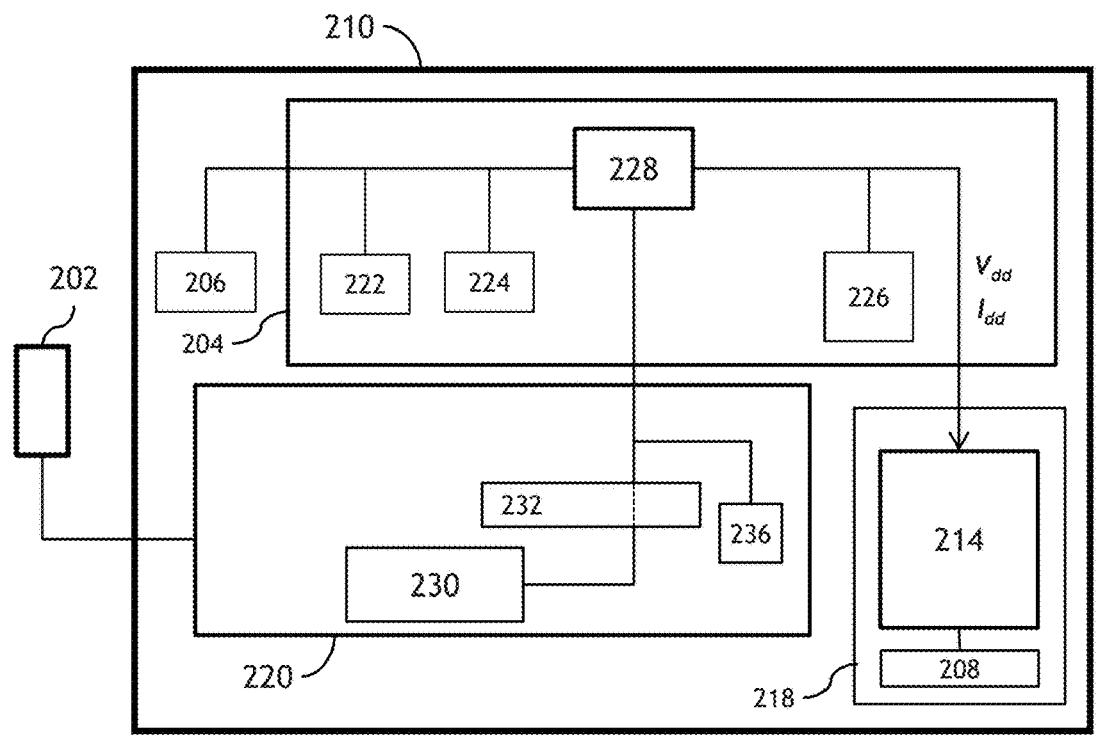
FIG. 6A is a block diagram.
Figure 6B:
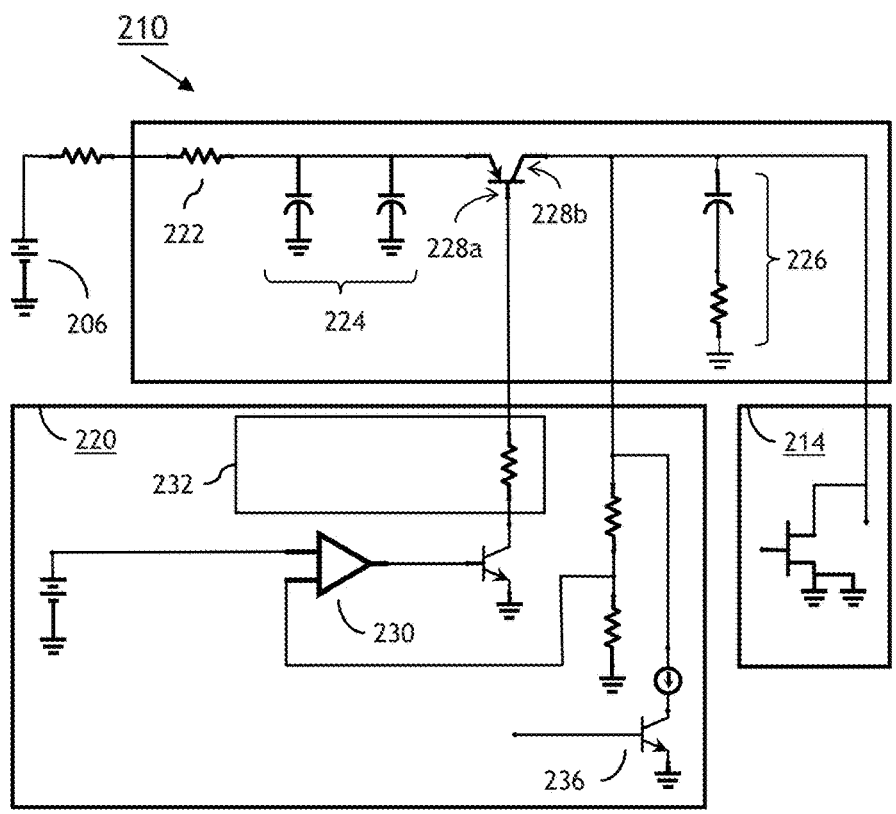
FIG. 6B is a schematic diagram, of systems for power amplifier drain bias tapering in an AESA system according to embodiments of the inventive concepts disclosed herein.

FIG. 6A illustrates a block diagram, and FIG. 6B the corresponding schematic diagram, of a drain voltage amplifier control (DRAVAC) system for maintaining a power amplifier 214 of an AESA array element 210 of an AESA system 200 at a constant gain compression point according to embodiments of the inventive concepts disclosed herein. In one embodiment, the array element 210 includes a built-in self-test (BIST) circuit 236 coupled to the pass device 228. For example, the BIST circuit 236 may be incorporated into the controller 220. In one embodiment, controller 220 is configured to perceive the output of voltage regulator 230 as well as the base drive 228a into pass device 228. For example, if the RF power amplifier 214 is not biased and not driven, and the BIST circuit 236 is active, all current passing through pass device 228 (from DC source 206) dissipates internal to the controller 220. In one embodiment, the magnitude of this current is known by design. For example, the common-emitter current gain $B_F = I_C/I_B$ of the pass device 228 corresponds to a ratio of DC base current 228a ($I_B$) to DC collector current 228b ($I_C$). Therefore the BIST circuit 236 may monitor the output power of RF power amplifier 214 by determining $B_F$, as the DC power supplied to RF power amplifier 214 is directly related to the power output of RF power amplifier 214. For example, DC power delivered to the RF power amplifier 214 is a multiplication of the drain voltage $V_{dd}$ and current $I_{dd}$ supplied to the load, the load, e.g., being a transistor of RF power amplifier 214. Accordingly, for a given RF power amplifier 214 where the device temperature, RF impedance match, and other parameters are known, the output power of RF PA 214 corresponding to a given DC input power may be calibrated throughout the array element 210 (or the AESA system 200), or calculated in real time based on known parameters.

Figure 7:
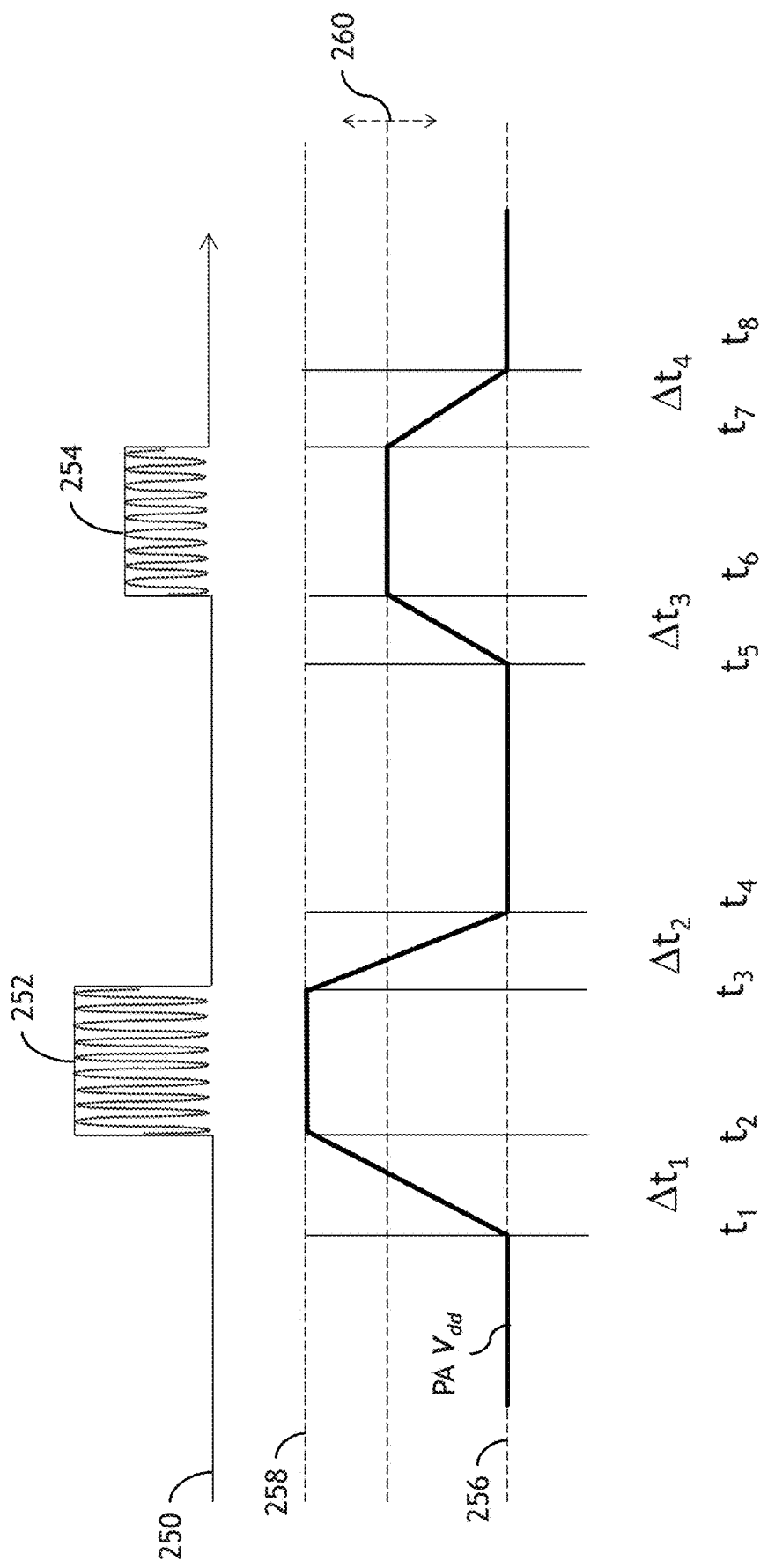
FIG. 7 is a diagrammatic illustration of drain voltage tapering in an AESA system according to embodiments of the inventive concepts disclosed herein.

As noted above, one advantage of the DRAVAC system over other approaches to RF power tapering is that each array element 210 of the AESA system 200 may be individually and dynamically programmed, monitored, and adjusted via the system processor 202 based on predetermined element configurations (i.e., target power or voltage levels) and/or messages from individual element controllers 220. FIG. 7 illustrates timing considerations related to the output of RF PA 214 in an AESA system 200 according to embodiments of the inventive concepts disclosed herein. In one embodiment, RF signal 250 includes RF pulses 252 and 254, where the amplitude of subsequent pulse 254 is lower than the amplitude of pulse 252. For example, RF signal 250 may be generated by RF signal source 102. In preparation for the increase in RF power (RF pulse 252) the drain voltage $V_{dd}$ to RF PA 214 may be adjusted from a minimum voltage 256 (at time $t_1$) to a maximum voltage 258 (at time $t_2$). In one embodiment, an RF pulse 254 corresponds to the transitioning of drain voltage $V_{dd}$ from a minimum voltage 256 to a controllable voltage 260 between the maximum and minimum values for $V_{dd}$.

Figure 8A:
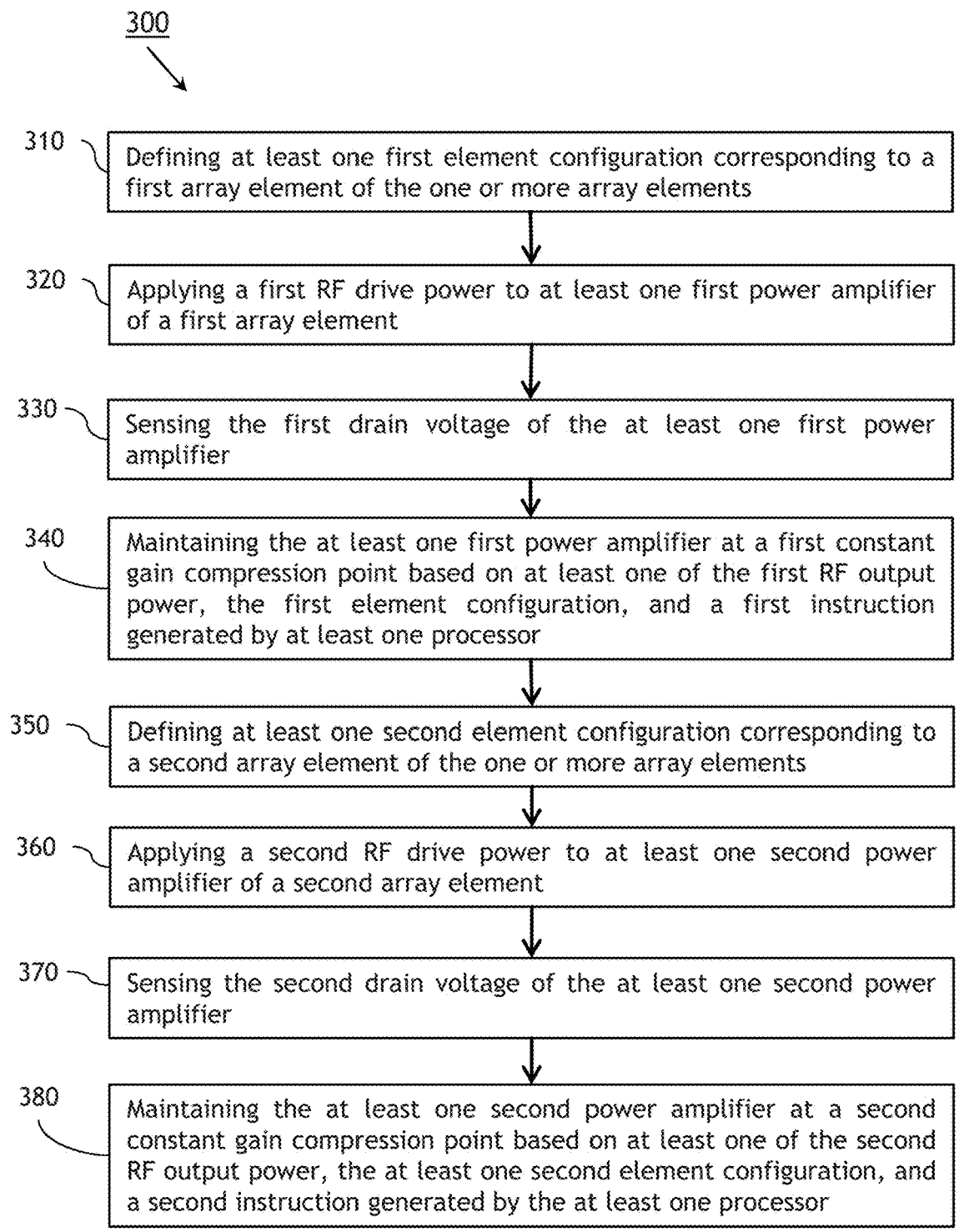
FIGS. 8A and 8B are process flow diagrams of a method according to embodiments of the inventive concepts disclosed herein.
Figure 8B:
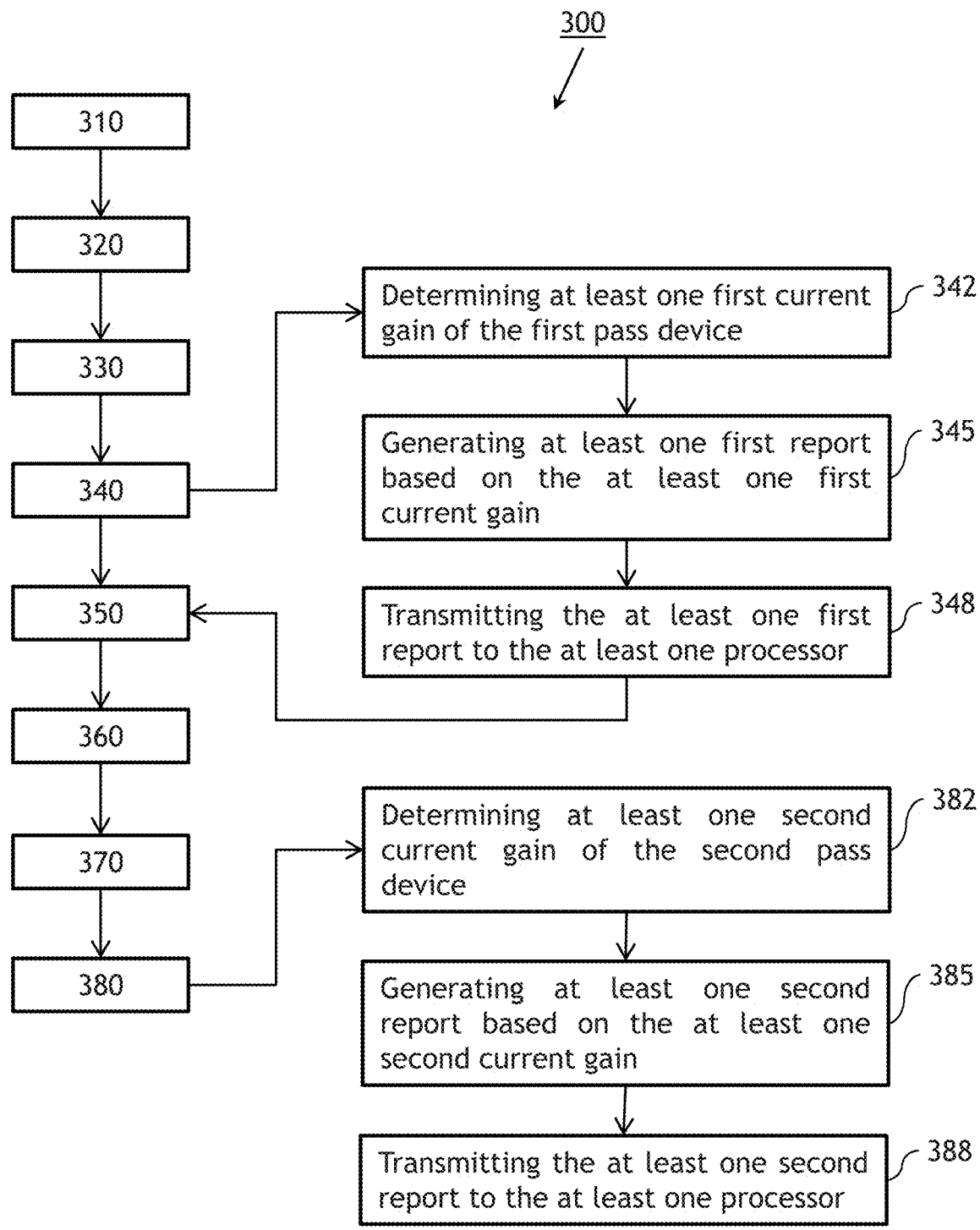

FIGS. 8A and 8B are process flow diagrams of a method 300 for operating a system 200 including at least one active electronically scanned array (AESA) element 210, according to embodiments of the inventive concepts disclosed herein. It is noted herein that the method 300 may be carried out utilizing any of the embodiments described previously. It is further noted, however, that method 300 is not limited to the components or configurations described previously as multiple components and/or configurations may be suitable for executing method 300.

Referring to FIG. 8A, at step 310 the method 300 defines at least one first element configuration corresponding to a first array element 210 of one or more first array elements of the at least one AESA 200. For example, the at least one first array element 210 may include at least one first pass device 228 and at least one first RF power amplifier 214 having a first peak power level. The at least one first RF power amplifier 214 may be supplied by a first drain voltage and configured to generate a first RF output power based on at least the first drain voltage. The first element configuration may include at least one of the first peak power level, a first drain voltage, a first RF drive power, a first constant gain compression point, and a first RF output power.

At step 320, applies a first RF drive power to at least one first RF power amplifier 214 of a first array element 210 of the at least one AESA 200.

At step 330, the method 300 senses the first drain voltage of the at least one first RF power amplifier 214.

At step 340, the method 300 maintains the at least one first RF power amplifier 214 at a first constant gain compression point based on at least one of the first RF output power, the at least one first element configuration, and a first instruction generated by at least one processor 202 of the AESA 200. In one embodiment, the method 300 maintains the at least one first RF power amplifier 214 at a constant gain compression point by adjusting at least one of the first RF drive power and the first drain voltage.

In one embodiment, the method 300 has additional steps 350, and 360, 370, and 380. At step 350, the method 300 defines at least one second element configuration corresponding to a second array element 210 of one or more second array elements of the at least one AESA 200. For example, the at least one second array element 210 may include at least one second pass device 228 and at least one second RF power amplifier 214b having a second peak power level. The at least one second RF power amplifier 214b may be supplied by a second drain voltage and configured to generate a second RF output power based on at least the second drain voltage. The second element configuration may include at least one of the second peak power level, a second drain voltage, a second RF drive power, a second constant gain compression point, and a second RF output power.

At step 360, the method 300 applies a second RF drive power to the at least one second RF power amplifier 214b of a second array element 210 of the at least one AESA 200.

At step 370, the method 300 senses a second drain voltage of the at least one second RF power amplifier 214b.

At step 380, the method 300 maintains the at least one second power amplifier 214b at a second constant gain compression point based on at least one of the second RF output power, the at least one second element configuration, and a second instruction generated by the at least one processor 202. In one embodiment, the method 300 maintains the at least one second RF power amplifier 214b at a constant gain compression point by adjusting at least one of the second RF drive power and the second drain voltage.

Referring to FIG. 8B, the method 300 may have additional steps 342, 345, 348, 382, 385, and 388. At step 342, the method 300 determines at least one first current gain of the first pass device 228. For example, a first BIST circuit 236 may determine a first beta (ex.—common-emitter current gain $B_F$) of the first pass device 228.

At step 345, the method 300 generates at least one first report based on the at least one first current gain. For example, the BIST circuit 236 may notify the controller 220 or the processor 202 of a detected fault or calculate the output power of a first RF power amplifier 214.

At step 348, the method 300 transmits the at least one first report to the at least one processor 202 of the AESA system 200.

At step 382, the method 300 determines at least one second current gain of the second pass device 228. For example, a second BIST circuit 236 may determine a second beta of the second pass device 228.

At step 385, the method 300 generates at least one second report based on the at least one second current gain. For example, the BIST circuit 236 may notify the controller 220 or the processor 202 of a detected fault or calculate the output power of a second RF power amplifier 214b.

At step 388, the method 300 transmits the at least one second report to the at least one processor 202 of the AESA system 200.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the inventive concepts disclosed herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

We claim:

1. A system for dynamically controlling an active electronically scanned array (AESA), comprising:
   at least one DC power source;
   a plurality of radiating elements, each radiating element configured to emit a radio frequency (RF) signal, the plurality of RF signals capable of combining into a steerable beam associated with at least one of a beam shape and a side lobe level, the plurality of radiating elements organized into at least three sets of radiating elements, a first set supplied by a first drain voltage, a second set supplied by a second drain voltage and completely circumscribed by the first set, and a third set supplied by a third drain voltage and completely circumscribed by the first set and second set;
   each radiating element including at least one power amplifier supplied by one or more drain voltages and configured to generate at least one RF output power based on the one or more supplied drain voltages, each radiating element in the first set of radiating elements associated with a power amplifier having a first peak voltage and configured to produce a first gain compression, each radiating element in the second set of radiating elements associated with a power amplifier having a second peak voltage and configured to produce a second gain compression, and each radiating element in the third set of radiating elements associated with a power amplifier having a third peak voltage and configured to produce a third gain compression, wherein each of the first gain compression, second gain compression, and third gain compression are distinct;
   each radiating element including at least one pass device coupled to the at least one DC power source and to the at least one power amplifier, the at least one pass device configured to generate the one or more drain voltages; and
   at least one controller coupled to the at least one pass device, the at least one controller configured to:
      sense the one or more supplied drain voltages generated by the at least one pass device;
      stabilize the supplied drain voltage via a voltage control loop comprising a loop compensation capacitor element;
      calibrate the at least one power amplifier based on the one or more supplied drain voltages, temperature, and RF impedance match;
      control one or more of the beam shape and the at least one side lobe level of the steerable beam by dynamically adjusting, via the at least one pass device, at least one drain voltage of the one or more supplied drain voltages and RF drive power to the at least one power amplifier to maintain the at least one power amplifier at saturation while tapering total RF output power;
      produce a first RF pulse having a first amplitude by transitioning the at least one drain voltage from a minimum voltage to a maximum voltage; and
      produce a second RF pulse having a second amplitude less than the first amplitude by transitioning the at least one drain voltage from the minimum voltage to a controllable voltage between the minimum voltage and the maximum voltage,
   wherein the first peak voltage is higher than the second peak voltage, and the second peak voltage is higher than the third peak voltage.

2. The AESA element of claim 1, wherein:
   the at least one power amplifier is incorporated in a first transmit/receive (T/R) RFIC and the at least one controller is incorporated in a second T/R RFIC; and
   the at least one first T/R RFIC and the at least one second T/R RFIC include at least one of a gallium arsenide (GaAs) RFIC, a silicon-based RFIC, and a monolithic microwave integrated circuit (MMIC).

3. The AESA element of claim 1, further comprising:
   at least one built-in self-test (BIST) circuit coupled to the at least one pass device and configured to monitor the one or more supplied drain voltages by determining at least one current gain associated with the at least one pass device.

4. The AESA element of claim 3, wherein the at least one controller is further configured to:
   generate at least one report based on the at least one current gain, the at least one report including at least one of a fault detection and an estimated output power.

5. The system of claim 1, wherein the at least one controller is configured to dynamically adjust, via the at least one pass device, the one or more drain voltages based at least on one or more element configurations, each element configuration associated with a radiating element of the plurality of radiating elements.

6. An active electronically scanned array (AESA), comprising:
a plurality of radiating elements, each radiating element configured to emit at least one radio frequency (RF) signal, the plurality of RF signals capable of combining into a steerable beam associated with at least one of a beam shape and a side lobe level, the plurality of radiating elements organized into at least three sets of radiating elements, a first set supplied by a first drain voltage, a second set supplied by a second drain voltage and completely circumscribed by the first set, and a third set supplied by a third drain voltage and completely circumscribed by the first set and second set, each radiating element comprising:
at least one DC power source;
at least one power amplifier supplied by one or more drain voltages and configured to generate at least one RF output power based at least on the one or more supplied drain voltages, each radiating element in the first set of radiating elements associated with a power amplifier having a first peak voltage and configured to produce a first gain compression, each radiating element in the second set of radiating elements associated with a power amplifier having a second peak voltage and configured to produce a second gain compression, and each radiating element in the third set of radiating elements associated with a power amplifier having a third peak voltage and configured to produce a third gain compression, wherein each of the first gain compression, second gain compression, and third gain compression are distinct;
at least one pass device coupled to the at least one DC power source and to the at least one power amplifier, the at least one pass device configured to generate the one or more drain voltages; and
at least one controller coupled to the at least one pass device and configured to:
sense the one or more supplied drain voltages generated by the at least one pass device;
stabilize the supplied drain voltage via a voltage control loop comprising a loop compensation capacitor element;
calibrate the at least one power amplifier based on the one or more supplied drain voltages, temperature, and RF impedance match;
control one or more of the beam shape and the at least one side lobe level of the steerable beam by dynamically adjusting, via the at least one pass device, at least one drain voltage of the one or more supplied drain voltages and RF drive power to the at least one power amplifier to maintain the at least one power amplifier at a constant gain compression point corresponding to the at least one RF output power while tapering total RF output power;
produce a first RF pulse having a first amplitude by transitioning the at least one drain voltage from a minimum voltage to a maximum voltage; and
produce a second RF pulse having a second amplitude less than the first amplitude by transitioning the at least one drain voltage from the minimum voltage to a controllable voltage between the minimum voltage and the maximum voltage,
wherein the first peak voltage is higher than the second peak voltage, and the second peak voltage is higher than the third peak voltage.

7. The AESA of claim 6, further comprising:
at least one first built-in self-test (BIST) circuit coupled to the at least one pass device, the at least one first BIST circuit configured to monitor the at least one RF output power by determining a common-emitter current gain.

8. The AESA of claim 7, wherein the at least one RF output power is directly related to a power output from the DC power source.

9. The AESA of claim 6, wherein:
the at least one power amplifier is incorporated in a first transmit/receive (T/R) RFIC and the at least one controller is incorporated in a second T/R RFIC; and
the at least one first T/R RFIC and the at least one second T/R RFIC include at least one of a gallium arsenide (GaAs) RFIC, a silicon-based RFIC, and a monolithic microwave integrated circuit (MMIC).

10. The AESA of claim 6, wherein the at least one controller is configured to dynamically adjust, via the at least one pass device, the one or more drain voltages based at least on one or more element configurations, each element configuration associated with a radiating element of the plurality of radiating elements.

11. A method for controlling an active electronically scanned array (AESA), comprising:
generating at least one steerable beam via the AESA, the steerable beam associated with one or more of a beam shape and a side lobe level and comprising one or more RF signals, each RF signal emitted by a radiating element of the AESA, by supplying at least one RF input power to at least one first power amplifier of the AESA array, the at least one power amplifier associated with the one or more radiating elements and with at least one RF output power;
sensing, via at least one controller couplable to at least one pass device associated with the one or more radiating elements, one or more drain voltages associated with the at least one first power amplifier and with the at least one RF input power, the one or more drain voltages generated via the at least one pass device;
stabilizing the supplied drain voltage via a voltage control loop comprising a loop compensation capacitor element;
calibrating the at least one power amplifier based on the one or more supplied drain voltages, temperature, and RF impedance match; and
controlling, via the at least one controller, one or more of the beam shape and the at least one side lobe level of the at least one steerable beam by dynamically adjusting, via the at least one pass device, at least one supplied drain voltage of the one or more drain voltages and RF drive power to the at least one power amplifier to maintain the at least one first power amplifier at a constant gain compression point corresponding to the at least one RF output power among a plurality of radiating elements in the AESA to produce a first RF pulse having a first amplitude by transitioning the at least one drain voltage from a minimum voltage to a maximum voltage, and produce a second RF pulse having a second amplitude less than the first amplitude by transitioning the at least one drain voltage from the minimum voltage to a controllable voltage between the minimum voltage and the maximum voltage, the plurality of radiating elements organized into at least three sets of radiating elements, a first set supplied by a first drain voltage, a second set supplied by a second drain voltage and completely circumscribed by the first set, and a third set supplied by a third drain voltage and completely circumscribed by the first set and second set, each radiating element in the first set of radiating elements associated with a power amplifier having a first peak voltage and configured to produce a first gain compression, each radiating element in the second set of radiating elements associated with a power amplifier having a second peak voltage and configured to produce a second gain compression, and each radiating element in the third set of radiating elements associated with a power amplifier having a third peak voltage and configured to produce a third gain compression, wherein each of the first gain compression, second gain compression, and third gain compression are distinct, wherein the first peak voltage is higher than the second peak voltage, and the second peak voltage is higher than the third peak voltage.

12. The method of claim 11, further comprising:

monitoring the one or more drain voltages by determining at least one first current gain associated with the at least one pass device;

generating at least one report based on the at least one determined current gain, the at least one report including at least one of a fault detection and an estimated output power; and transmitting the at least one report to at least one controller associated with the AESA array.

* * * * *